United States Patent
Dunn et al.

(10) Patent No.: US 11,522,545 B1
(45) Date of Patent: Dec. 6, 2022

(54) SEMICONDUCTOR DEVICE STRUCTURE FOR WIDE SUPPLY VOLTAGE RANGE

(71) Applicant: Solomon Systech (Shenzhen) Limited, Shenzhen (CN)

(72) Inventors: Pak-Kong Dunn, Hong Kong (CN); Wen-Chi Wu, Taiwan (TW); Po Yen Lin, Hong Kong (CN); Hai Bin You, Shenzhen (CN)

(73) Assignee: Solomon Systech (Shenzhen) Limited, Shenzhen (CN)

( * ) Notice: Subject to any disclaimer, the term of this patent is extended or adjusted under 35 U.S.C. 154(b) by 0 days.

(21) Appl. No.: 17/647,475

(22) Filed: Jan. 10, 2022

(30) Foreign Application Priority Data

Nov. 2, 2021 (CN) .......................... 202111291049.3
Dec. 30, 2021 (CN) .......................... 202111649295.1

(51) Int. Cl.
  *H03K 19/0185* (2006.01)
  *H01L 29/78* (2006.01)
  *H03K 3/037* (2006.01)

(52) U.S. Cl.
  CPC . *H03K 19/018521* (2013.01); *H01L 29/7817* (2013.01); *H03K 3/037* (2013.01); *H03K 19/018528* (2013.01)

(58) Field of Classification Search
  CPC .......... H01L 29/7817; H03K 19/0185–018528
  See application file for complete search history.

(56) References Cited

U.S. PATENT DOCUMENTS

| | | | |
|---|---|---|---|
| 9,257,973 B1 * | 2/2016 | Shay .............. | H03K 19/018528 |
| 9,940,867 B2 * | 4/2018 | Tsuchi ................ | G09G 3/2092 |
| 10,296,075 B2 * | 5/2019 | Wang ........................ | G06F 1/26 |

\* cited by examiner

*Primary Examiner* — Patrick O Neill
(74) *Attorney, Agent, or Firm* — S&F/WEHRW

(57) ABSTRACT

A level shifter circuit for translating input signal to output signal is disclosed. The level shifter includes an input stage and a latch stage. The latch stage comprises at least a transistor characterized in a substantially matched transconductance with the input stage for preventing a discrete realization of a voltage clamp circuit. The transistor is a semiconductor device including a source region having a source doping region and a drain region having a first doping region and a second doping region. The first doping region is doped with a first conductivity impurity. The second doping region is disposed around the first doping region so as to surround the first doping region, and is doped with a second conductivity impurity. The second doping region has a higher on-resistance than the first doping region, thereby a high resistive series path is created by the second doping region to mimic an embedded resistor.

24 Claims, 9 Drawing Sheets

SEMICONDUCTOR DEVICE STRUCTURE FOR WIDE SUPPLY VOLTAGE RANGE

CROSS-REFERENCE TO RELATED APPLICATIONS

This application claims the benefit of China Invention Patent Application No. 202111291049.3, filed on Nov. 2, 2021, and China Invention Patent Application No. 202111649295.1, filed on Dec. 30, 2021, which are incorporated by reference herein in its entirety.

LIST OF ABBREVIATIONS

DMOS double-diffused metal-oxide semiconductor
EPI epitaxy
GND ground
I/O input/output
IC integrated circuit
ISO isolation
HVMOS high-voltage metal-oxide semiconductor
HVN high-voltage NMOS
HVNW high-voltage N-Well
HVP high-voltage PMOS
HVPW high-voltage P-Well
LDMOS laterally-diffused metal-oxide semiconductor
MOSFET metal-oxide-semiconductor field-effect transistor
NLDD N-type lightly doped drain
NMOS N-channel metal-oxide semiconductor
PMOS P-channel metal-oxide semiconductor
PWR power
RDSon on-resistance
STI shallow trench isolation
VBIAS bias voltage

FIELD OF THE INVENTION

The present invention relates to the field of semiconductor process technology, and in particular, to a layout structure of a semiconductor device for simplifying the circuit complexity in a circuit with a wide supply voltage range.

BACKGROUND OF THE INVENTION

MOSFET is widely used in different digital circuits and analog circuits for various fields of applications. It can achieve a high breakdown voltage and a large current capacity, which can be integrated into a control circuit, a logic block, a power switch, and other circuits. In order to achieve the desired performance, reducing the RDSon during the conduction state of the MOSFET is one of the design considerations for minimizing the conduction loss, thereby the power consumption and delay can be lowered.

Particularly in a multi-voltage system, level shifters are commonly used for converting a signal from one voltage domain to another voltage domain. Circuitry may be configured to operate an IC with a smaller voltage for power conservation, and drive a higher output voltage for controlling an external device such as another IC. For instance, the core logic circuit of the IC uses 1.2V and 0V for representing logic 1 and 0, and the I/O circuit uses 5V and 0V for representing logic 1 and logic 0. The level shifter can be disposed between the core logic circuit and the I/O circuits for translating a signal from the core logic circuit to another signal for the I/O circuit. In certain applications, the level shifter has a wide supply voltage range. However, the highly repeated level shifters may suffer from the problem of racing at transition as a result of the voltage range. Hence, the level shifters are required to be modified for handling such a wide supply voltage range, and to compensate for any transconductance variation.

With reference to the ideal case of the level shifter 1A, as illustrated in FIG. 1, the conventional level shifter 1A comprises an input stage 20 (HVP1 21 and HVP2 22) and a latch stage 10 having cross-coupled NMOS transistors (HVN1 11 and HVN2 12). The operation of the conventional level shifter 1A will be described below for the sake of explaining the problem encountered when the supply voltage range is wide.

When the input signal IN is in a logic low state, such as ground, the HVP1 21 turns on and conducts. The same input signal IN is inverted by the inverter 31 and so the HVP2 22 is turned off. This pulls the Qb node at the drain of the HVP1 21 to PWR (such as 3.3V). The Qb node is also connected to the gate of the HVN2 12. The transition of Qb node can therefore turn on HVN2 12, and pulls the Q node to low PWR (such as −20V or 0V). As a result, HVN1 11 is turned off by the Q node. The same concept can also be applied when the input signal IN is in a logic high state. The conventional level shifter 1A can achieve a very low quiescent current consumption and the output delay can also be minimized. The conventional level shifter 1A is characterized in a wide supply voltage range which, as demonstrated in the illustrated embodiments, can translate an input voltage from a low-voltage domain to an output voltage from a high-voltage domain (5 to 20 times of the input voltage level) that is suitable for the desired operation. For example, the input voltage may be in the range of 3.3V, and the output voltage across Q node and Qb node is in the range of 23.3V.

Nonetheless, the level shifter 1A of FIG. 1 is an ideal condition without considering the actual physical characteristics when implementing the circuit in silicon. In a practical case, the difference of the driving voltage between the input stage 20 (HVP1 21 and HVP2 22) and the latch stage 10 having cross-coupled NMOS transistors (HVN1 11 and HVN2 12) will result in a racing condition at transition. The transconductance increases when the gate voltage of the transistor increases. The HVP1 21 and HVP2 22 are required to have an increased area in order to match with the NMOS transistors HVN1 11, HVN2 12.

There are a few approaches to solve the problem as highlighted above. Referring to FIG. 2, there is provided an alternative level shifter 1B commonly used for preventing the racing condition at transition. The HVN1 11 and HVN2 12 have low driving by means of the addition of two current sources formed by HVN3 41 and HVN4 42 as voltage clamp circuit 40 for reducing the RDSon, which are respectively connected in series with HVN1 11 and HVN2 12. These voltages on the two additional NMOS transistors HVN3 41 and HVN4 42 are controlled by their conductivity. The drawbacks of this alternative level shifter 1B are the need for additional transistors and the VBIAS reference circuit for compensating the output voltage variation, which undesirably and inevitably requires a larger die size.

Accordingly, there is a need in the art for a structure that seeks to address at least some of the above problems identified in a circuit with a wide supply voltage range. Furthermore, other desirable features and characteristics will become apparent from the subsequent detailed description and the appended claims, taken in conjunction with the accompanying drawings and this background of the disclosure.

SUMMARY OF THE INVENTION

Provided herein is a layout structure of a semiconductor device for simplifying the circuit complexity in a circuit with a wide supply voltage range. It is an objective of the present disclosure to provide a structure that can prevent racing at transition without the need to include complexity circuitry to the level shifter.

In accordance with the embodiments of the present disclosure, a level shifter circuit for translating input signal of a first voltage domain to output signal of a second voltage domain is disclosed. The level shifter includes an input stage, and a latch stage. The input stage receives the input signal. The latch stage couples to the input stage for storing a logic state associated with the input signal and generating the output signal. The latch stage comprises at least a transistor characterized in a substantially matched transconductance with the input stage for preventing a discrete realization of a voltage clamp circuit or a significant increase in transistor area. The transistor is a semiconductor device including a source region having a source doping region formed below a source terminal, and a drain region having a first doping region and a second doping region, both formed below a drain terminal. The first doping region is doped with a first conductivity impurity. The second doping region is disposed around the first doping region so as to surround the first doping region, and is doped with a second conductivity impurity. The second doping region has a higher on-resistance than the first doping region, thereby a high resistive series path is created by the second doping region to mimic an embedded resistor.

In accordance with a further aspect of the present disclosure, the drain region is disposed in a first well region of a first conductive type, and the source region is disposed in a second well region of a second conductive type different from the first well region.

In accordance with the first aspect of the present disclosure, the second doping region has a lower doping concentration of the first conductive type than the first doping region. The first well region is a high-voltage N-well and the second well region is a high-voltage P-well; and the first doping region is a heavily doped N+ region, and the second doping region is a lightly doped N+ region. Alternatively, the first well region is a high-voltage P-well and the second well region is a high-voltage N-well, and the first doping region is a heavily doped P+ region, and the second doping region is a lightly doped P+ region.

In accordance with the second aspect of the present disclosure, the first doping region has a doping of the first conductive type; and the second doping region has a doping of the second conductive type. The first well region is a high-voltage N-well and the second well region is a high-voltage P-well; and the first doping region is an N+ region, and the second doping region is a P+ region. Alternatively, the first well region is a high-voltage P-well and the second well region is a high-voltage N-well; and the first doping region is a P+ region, and the second doping region is an N+ region.

In accordance with a further aspect of the present disclosure, the second doping region is formed by plural vertical strips, plural horizontal strips, or a checkerboard arrangement of the second conductive type with a higher doping concentration than the first well region.

In accordance with a further aspect of the present disclosure, the drain region is disposed in a first well region of the first conductive type, and the source region is disposed in a second well region of the first conductive type, thereby the transistor has a symmetrical structure of the source region and the drain region.

In accordance with a further aspect of the present disclosure, the drain terminal, the source terminal, or both the drain and source terminals have reduced active areas for reducing an effective channel width, thereby the high resistive series path has a higher resistance.

In accordance with a further aspect of the present disclosure, the semiconductor device further comprises a gate electrode disposed on a gate insulating layer for forming a conduction channel between the source region and the drain region, and wherein the high resistive series path is formed between the first doping region and the conduction channel.

In accordance with a further aspect of the present disclosure, the semiconductor device further comprises a shallow trench isolation region adjacent to the second doping region and at least partially under the gate insulating layer.

In accordance with a further aspect of the present disclosure, the latch stage comprises a pair of cross-coupled transistors.

This Summary is provided to introduce a selection of concepts in simplified forms that are further described below in the Detailed Description. This Summary is not intended to identify key features or essential features of the claimed subject matter, nor is it intended to be used as an aid in determining the scope of the claimed subject matter. Other aspects and advantages of the present invention are disclosed as illustrated by the embodiments hereinafter.

BRIEF DESCRIPTION OF THE DRAWINGS

The appended drawings contain figures to further illustrate and clarify the above and other aspects, advantages, and features of the present disclosure. It will be appreciated that these drawings depict only certain embodiments of the present disclosure and are not intended to limit its scope. It will also be appreciated that these drawings are illustrated for simplicity and clarity and have not necessarily been depicted to scale. The present disclosure will now be described and explained with additional specificity and detail through the use of the accompanying drawings in which.

DETAILED DESCRIPTION OF THE INVENTION

Figure 1:
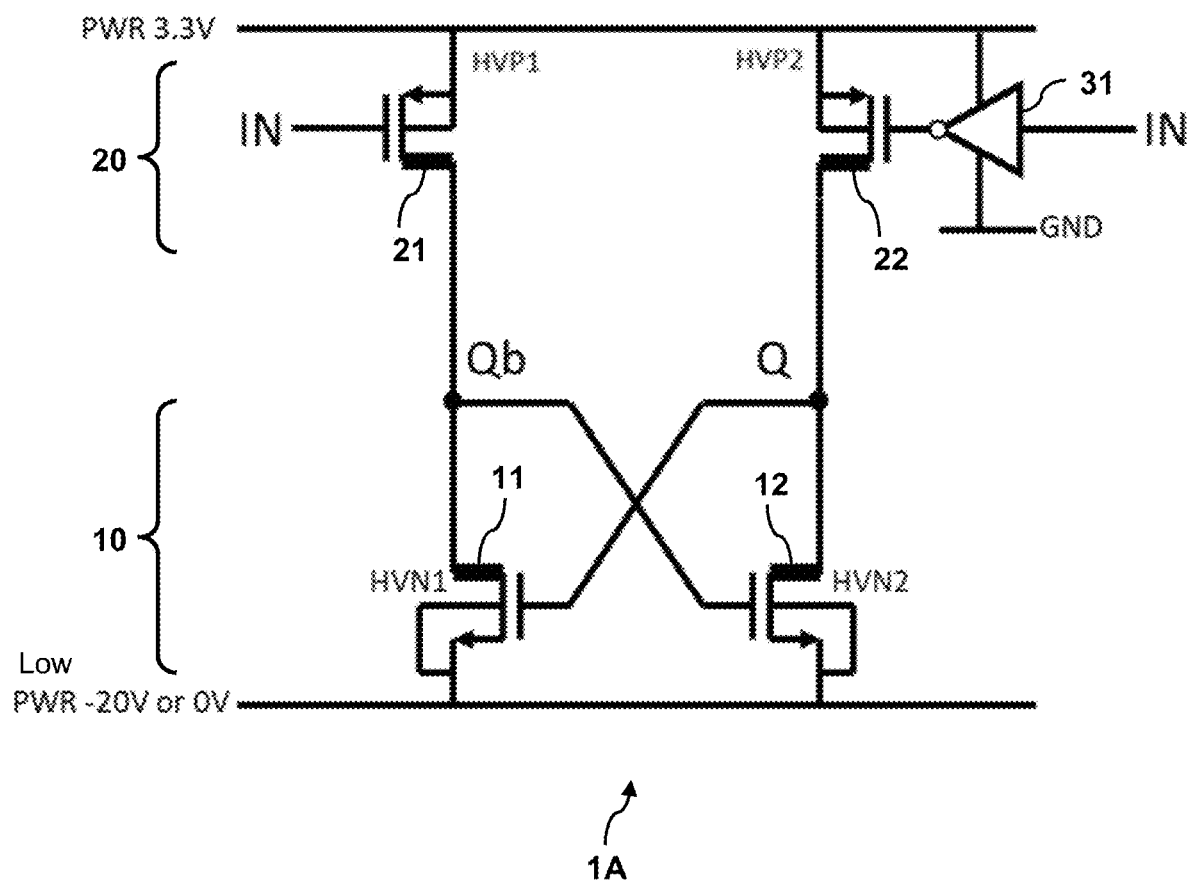
FIG. 1 depicts an ideal case of a level shifter.

The present disclosure generally relates to a semiconductor process device and the configuration thereof. More specifically, but without limitation, the present disclosure relates to a layout structure of a semiconductor device for simplifying the circuit complexity in a circuit with a wide supply voltage range. The semiconductor process device may be implemented using MOSFET, for example, PMOS, NMOS, or HVMOS (DMOS and LDMOS) transistors. An objective of the present disclosure is to avoid the racing condition at transition in a circuit having a wide supply voltage range by modifying the processing structure and/or the layout design.

The following detailed description is merely exemplary in nature and is not intended to limit the disclosure or its application and/or uses. It should be appreciated that a vast number of variations exist. The detailed description will enable those of ordinary skilled in the art to implement an exemplary embodiment of the present disclosure without undue experimentation, and it is understood that various changes or modifications may be made in the function and structure described in the exemplary embodiment without departing from the scope of the present disclosure as set forth in the appended claims.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The terms "comprising," "having," and "including" are to be construed as open-ended terms (i.e., meaning "including, but not limited to,") unless otherwise noted. The use of any and all examples, or exemplary language (e.g., "such as") provided herein, is intended merely to illuminate the invention better and does not pose a limitation on the scope of the invention unless otherwise claimed. No language in the specification should be construed as indicating any non-claimed element as essential to the practice of the invention.

The benefits, advantages, solutions to problems, and any element(s) that may cause any benefit, advantage, or solution to occur or become more pronounced are not to be construed as critical, required, or essential features or elements of any or all of the claims. The invention is defined solely by the appended claims including any amendments made during the pendency of this application and all equivalents of those claims as issued.

As used herein throughout the specification, notations $N^+$, N, $P^+$, and P indicate relative levels of impurity concentration in each conductivity type. That is, N+ indicates an N-type impurity concentration higher than that of N, and P+ indicates a P-type impurity concentration higher than that of P. For simplicity and clarity, an N+-type is sometimes referred to as an N-type, and a P+-type is sometimes referred to as a P-type.

These examples and other embodiments described in the present disclosure may be implemented in one single die or in separate dies. Alternatively, the invention can also be implemented using more than one die stack, or embedded in an integrated circuit with intellectual property blocks. Various modes can be implemented according to the examples described in the present disclosure. An ordinary skilled person in the art will easily understand after reading the present disclosure, additional or other benefits can be achieved through various examples.

Unless otherwise defined, all terms (including technical and scientific terms) used in the embodiments of the present invention have the same meaning as commonly understood by an ordinary skilled person in the art to which the present invention belongs.

The present disclosure discusses a specific context of a level shifter, which is a circuit that is highly repeated in an IC device. By minimizing the size of the level shifter, the die size of the IC device can be significantly reduced. The invention may be applied, however, to other types of circuits and systems, for instance, in a circuit for a multi-voltage system comprising a first system block and a second system block, the present disclosure can be applied to a voltage switching module for transmitting a signal from the first system block operating at a first voltage level to the second system block operating at a second voltage level. Another example is an discrete electronic component having a data input module, a data output module, and a voltage switching module comprising a lever shifter for translating a signal from the data input module to the data output module, wherein the voltage switching module comprises a level shifter for translating an input signal of a first voltage domain from the data input module to an output signal of a second voltage domain for the data output module.

Figure 2:
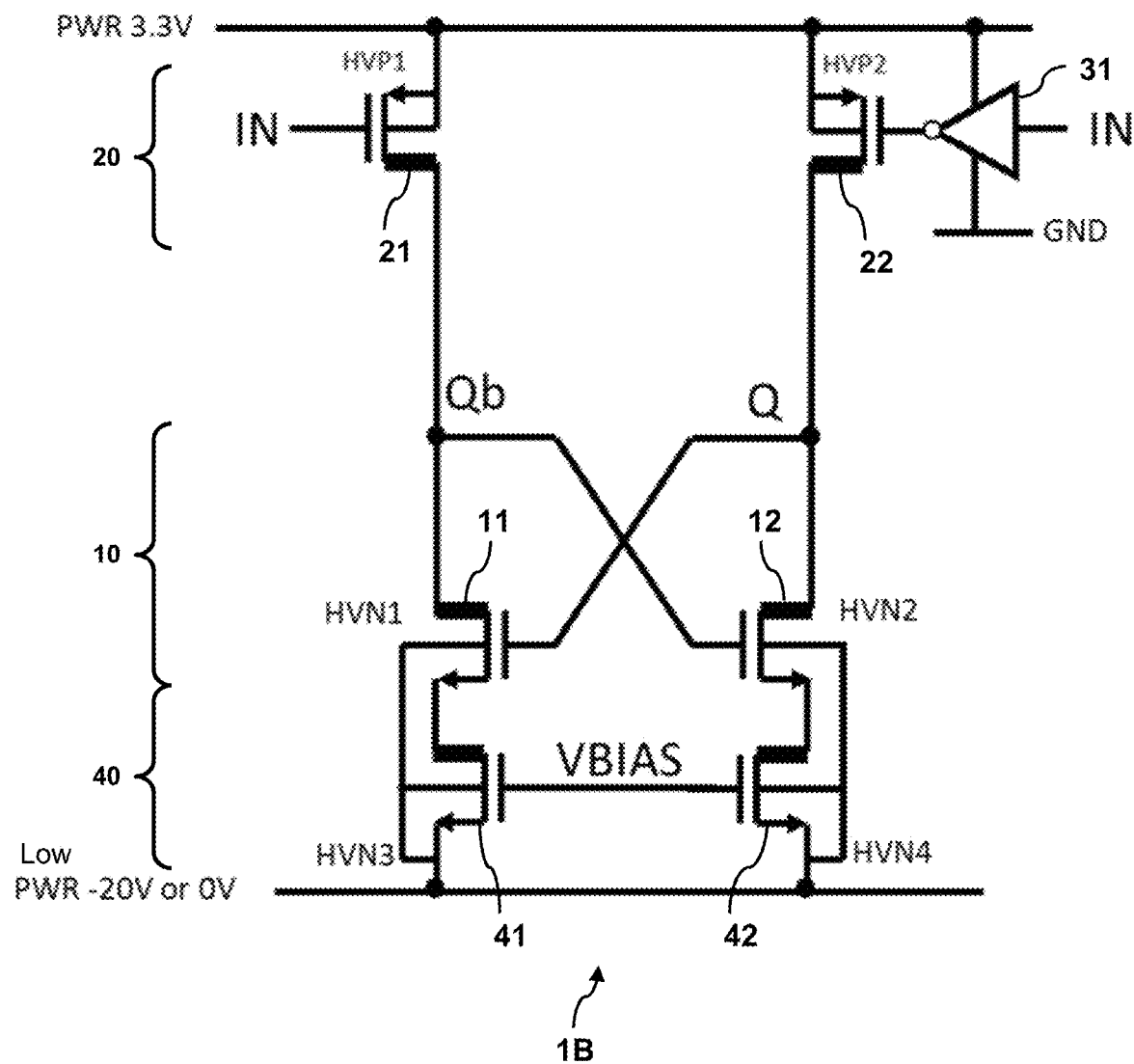
FIG. 2 depicts a practical case of a level shifter commonly used for preventing the racing condition at transition.

As shown in FIG. 1 and FIG. 2, the conventional level shifter 1A, 1B, particularly for a multi-voltage system, has a race condition during the transition when operating with a wide supply voltage range. The level shifter is generally used for translating an input signal of a first voltage domain to an output signal of a second voltage domain. For example, the input voltage has a first voltage domain limited by 3.3V, while the output voltage has a second voltage domain limited by 23.3V. This requires a relatively significant increase in the low-voltage conversion area in order to avoid the race condition. This can be done by increasing the transistor size of the PMOS transistors HVP1 21, HVP2 22 at the input stage 20 to match with the NMOS transistors at the latch stage 10. The present invention provides a device modification for increasing the RDSon of the first and second high-voltage transistors HVN1 11 and HVN2 12, which is substantially equivalent to adding an embedded resistor in series to the drain. Therefore, the novel structure is optimized to avoid the race condition without significantly increasing the die size and cost.

Figure 3:
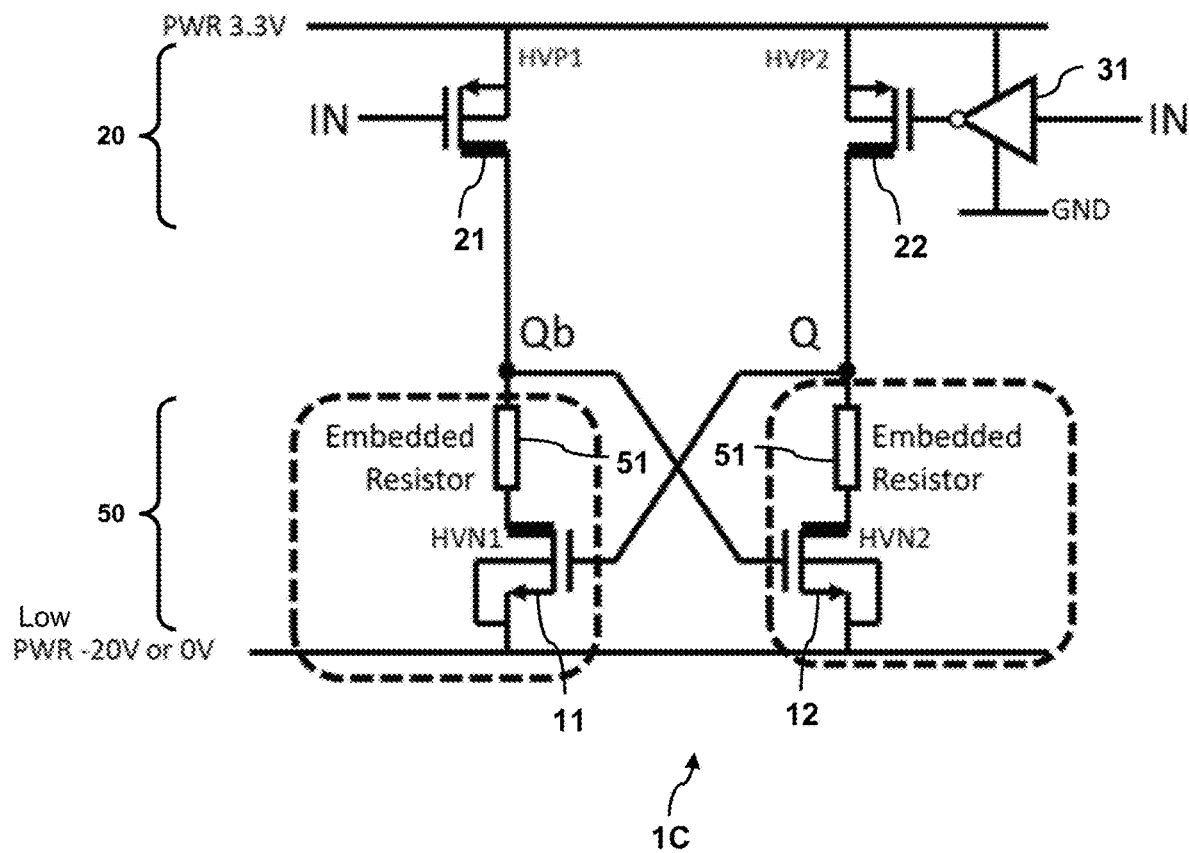
FIG. 3 depicts a circuit diagram of a level shifter having an embedded resistor at the drain of the NMOS transistor in accordance with certain embodiments of the present disclosure.

FIG. 3 shows a circuit diagram of a level shifter 1C having an embedded resistor at the drain of the NMOS transistor for simplifying the circuit complexity of a circuit with a wide supply voltage range, thereby the die area can be minimized. The level shifter 1C is configured to translate an input voltage from a first voltage domain to an output voltage from a second voltage domain that is suitable for the desired operation. For example, the input voltage may be in the range of 3.3V, and the output voltage across Q node and Qb node is in the range of 23.3V. The second voltage domain may be a few times or over 20 times larger than the first voltage domain. The level shifter 1C contains an input stage 20 made of PMOS transistors 21, 22 and inverter 31, and a latch stage 50. The input stage 20 receives the input signal IN at the gate of HVP1 21, and the gate of the HVP2 22 is driven by the inverted input signal IN, which is inverted by the inverter 31. The inverter 31 is referenced to a high voltage of PWR and a low voltage of GND. The input signal IN is also ranged between PWR and GND, which is the first voltage domain. The drains of the two PMOS transistors (HVP1 21, HVP2 22) are respectively electrically connected to drive a pair of cross-coupled NMOS transistors (HVN1 11 and HVN2 12) at the latch stage 50. When the variation of the output voltage (second voltage domain) is so large, the transconductance of the HVN1 11 and HVN2 12 would be very large as the gate drive voltage changes significantly. Instead of using the conventional method of optimizing the circuit, the present disclosure provides an alternative method to solve the problem by modifying the device structure. The latch stage 50 couples to the input stage 20 for storing a logic state associated with the input signal received from the input stage 20 and generates an output signal at Q and Qb nodes. The pair of cross-coupled NMOS transistors (HVN1 11 and HVN2 12) has at least a transistor characterized in that the drain has a higher RDSon equivalent to an extra embedded resistor 51 connected in series, thereby the transistor has a substantially matched transconductance with the input stage 20 for preventing a discrete realization of a voltage clamp circuit as of FIG. 2 or a substantial increase in transistor area for matching. In an actual implementation, depending on the ratio between the second voltage domain and the first voltage domain, and the ratio between the input stage 20 to the latch stage 50, the RDSon can be increased by approximately 4 to 20 times. More preferably, both HVN1 11 and HVN2 12 have higher RDSon so that there is less chance of error due to wafer-to-wafer variations and die-to-die variations.

Figure 4:
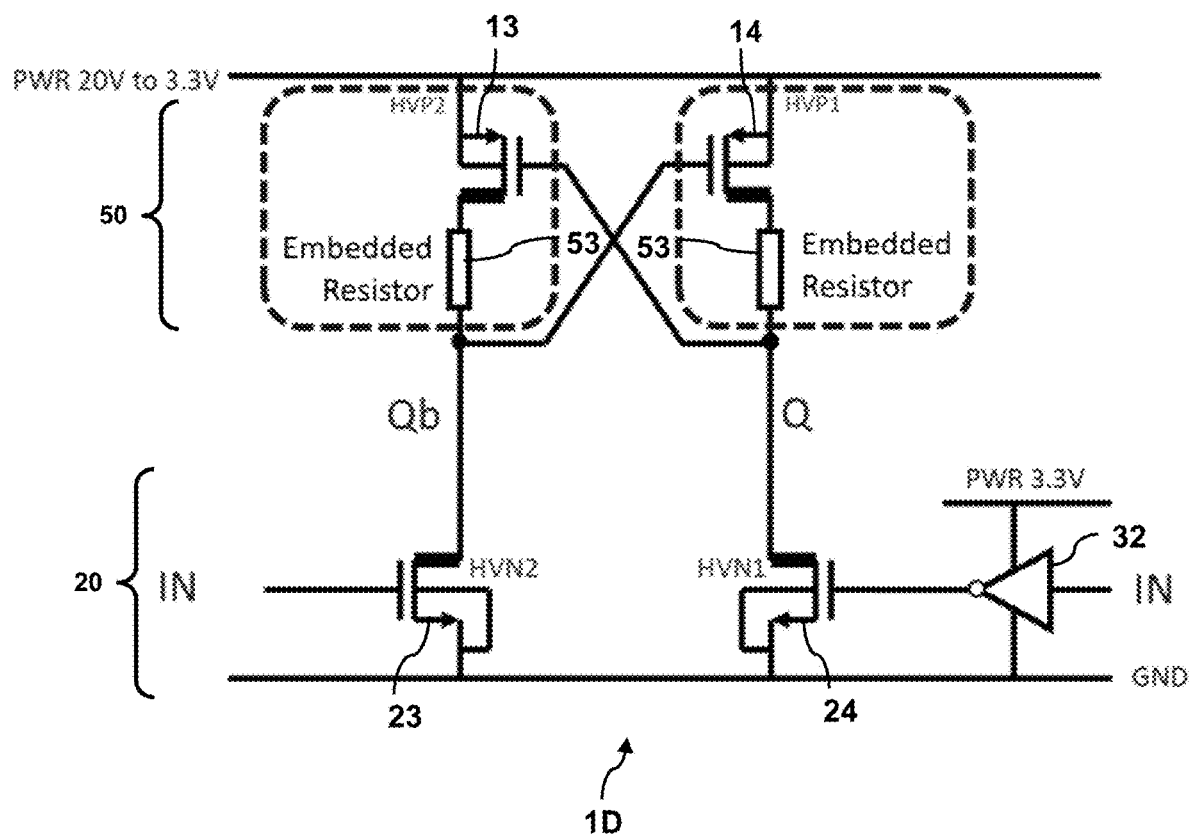
FIG. 4 depicts a circuit diagram of a level shifter having an embedded resistor at the drain of the PMOS transistor in accordance with another embodiment of the present disclosure.

Likewise, the present invention is also applicable to level shifter 1D using PMOS transistors with the same benefit. As shown in FIG. 4, the circuit diagram of a level shifter 1D having an embedded resistor at the drain of the PMOS transistor is provided. By reversing the NMOS and PMOS of that shown in FIG. 3, the input stage 20 is made of NMOS transistors 23, 24 for receiving the input signal IN at the gate of HVN2 23, and the gate of the HVN1 24 is driven by the inverted input signal IN, which is inverted by the inverter 32. The inverter 32 is referenced to a high voltage of PWR and a low voltage of GND. The input signal IN is also ranged between PWR and GND, which is the first voltage domain. The drains of the two NMOS transistors (HVN2 23, HVN1 24) are respectively electrically connected to drive a pair of cross-coupled PMOS transistors (HVP2 13 and HVP1 14) at the latch stage 50. The latch stage 50 couples to the input stage 20 for storing a logic state associated with the input signal received from the input stage 20 and generates an output signal at Qb and Q nodes. The pair of cross-coupled PMOS transistors (HVP2 13 and HVP1 14) has at least a transistor characterized in that the drain has a higher RDSon equivalent to an extra embedded resistor 53 connected in series, thereby the transistor has a substantially matched transconductance with the input stage 20 for preventing a discrete realization of a voltage clamp circuit as of FIG. 2 or a substantial increase in transistor area for matching. More preferably, both HVP2 13 and HVP1 14 have higher RDSon so that there is less chance of error due to wafer-to-wafer variations and die-to-die variations.

Figure 5:
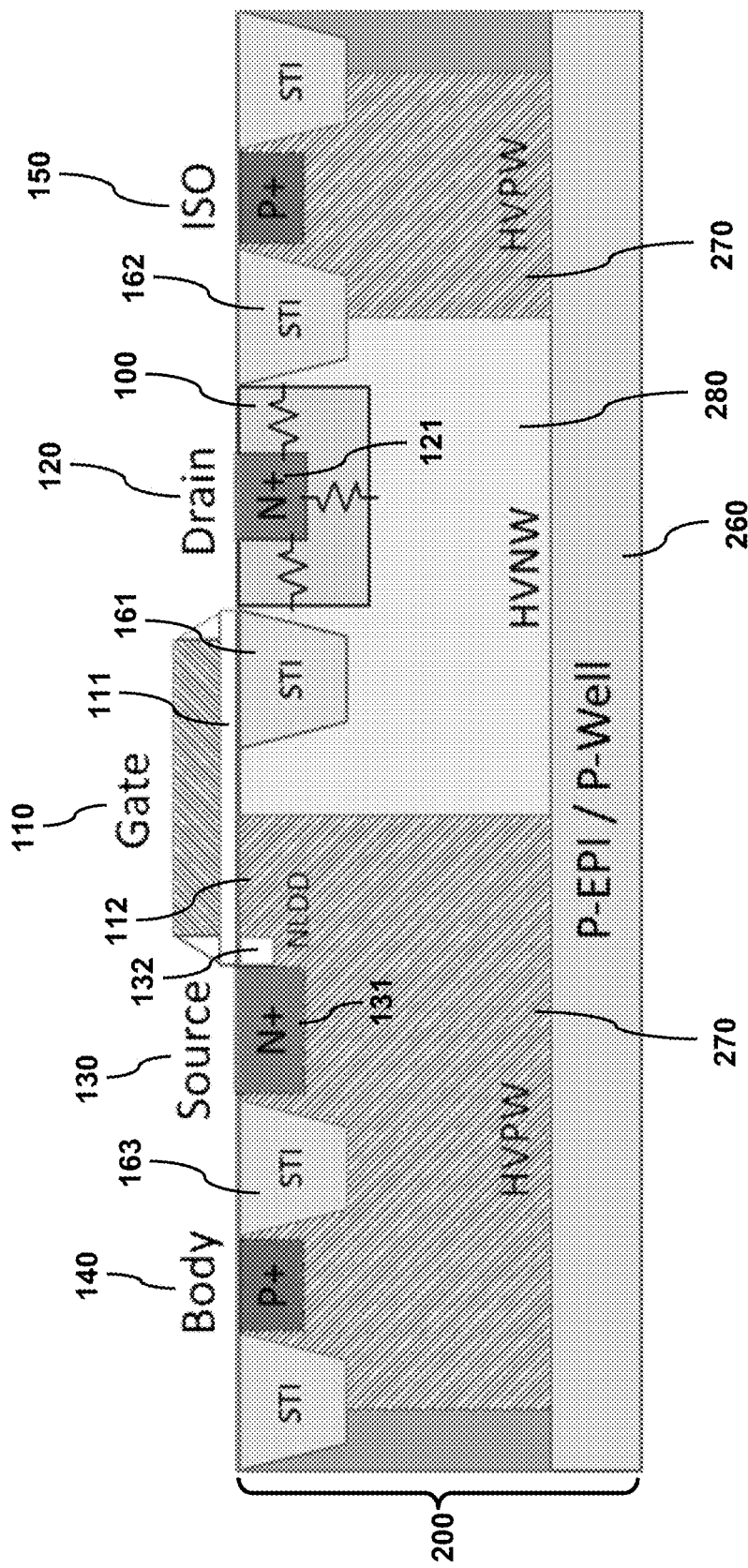
FIG. 5 depicts a cross-sectional view of the layout structure of the NMOS transistor in an asymmetric structure for the level shifter of FIG. 3 in accordance with certain embodiments of the present disclosure.

The semiconductor device structure for achieving the higher RDSon is depicted in FIG. 5, which is a cross-sectional view of the layout structure of one of the cross-coupled NMOS transistors (HVN1 11 or HVN2 12) implemented in the latch stage 50 with an asymmetric structure. In the preferred embodiment, this structure is implemented in the level shifter of FIG. 3, which can be used for simplifying the circuit complexity in a circuit with a wide supply voltage range. Although NMOS is illustrated for demonstrating the present invention, it is obvious to one skilled in the art that a similar structure can be implemented using other MOSFET, for example, PMOS transistor, without departing from the scope and spirit of the present invention.

The semiconductor device includes a gate electrode 110, a source region 130, a drain region 120, and a body region 140, all formed on a substrate 200 having an EPI layer 260, and one or more well regions such as HVPW 270 and HVNW 280.

The illustrated embodiment in FIG. 5 is an NMOS transistor, and so the EPI layer 260 is a P-EPI or P-Well. Formed on the substrate 200, the body region 140 is tied to the source region 130 and provided in an HVPW 270 to obtain an asymmetric structure. The body region 140 is therefore a P-type, and an ISO region 150 is formed within the substrate for defining the body region 140. The ISO region 150 may be formed from an HVPW 270.

The drain region 120 is disposed in a first well region of a first conductive type, which is an HVNW 280 for an NMOS transistor. The source region 130 is disposed in a second well region of a second conductive type different from the first well region, which is an HVPW 270 arranged next to the first well region. Alternatively, when the transistor is a PMOS transistor, the body region 140 and the EPI layer 260 are N-type. The first well region for the drain is an HVPW 270 and the second region for the source is an HVNW 280 instead.

The gate electrode 110 is disposed on a gate insulating layer 111 for forming a conduction channel 112 on the substrate 200 between the source region 130 and the drain region 120. The gate electrode 110 is electrically connected to the Qb or Q node and the drain terminal of the other transistor in the cross-coupled configuration.

The source region 130 has a source doping region 131 formed vertically below a source terminal (not shown) arranged for connecting or wiring. The source doping region 131 is doped with the first conductive type, e.g., N+ conductivity impurity as shown in the illustrated embodiment for the case of NMOS transistor, with an NLDD 132 extended laterally from the source doping region 131. The source region 130 and the body region 140 are separated and isolated by at least an STI region 163 on the upper surface of the substrate 200.

The drain region 120 has a first doping region 121 and a second doping region 100 formed vertically below a drain terminal (not shown) arranged for connecting or wiring. The first doping region 121 is doped with a first conductivity impurity. The second doping region 100 disposed around the first doping region 121 is provided to increase the RDSon at the drain terminal. In particular, the second doping region 100 is doped with a second conductivity impurity different from the first conductivity impurity. There are a few different configurations for realizing the high resistive path at the drain region 120. Below provided are two typical arrangements and it is apparent to one skilled in the art that other alternatives can be derived based on the same inventive concept.

In the first embodiment, the second doping region 100 has a lower doping concentration of the first conductive type than the first doping region 121. For example, the first doping region 121 is a heavily doped N+ region while the second doping region 100 is a lightly doped N+ region for NMOS transistor. Similarly, the first doping region 121 is a heavily doped P+ region while the second doping region 100 is a lightly doped P+ region for PMOS transistor.

In the second embodiment, the first doping region has a doping of the first conductive type, and the second doping region 100 has a doping of the second conductive type. For example, the first doping region 121 is an N+ region while the second doping region 100 is a P+ region for the case of NMOS transistor. Similarly, the first doping region 121 is a P+ region while the second doping region 100 is an N+ region for the case of PMOS transistor. With this configuration, the second doping region 100 has a higher RDSon than the first doping region 121, thereby a high resistive series path is created by the second doping region 100 to mimic an embedded resistor 51 or 53 for the cross-coupled transistor.

On the drain region 120 and at least partially under the gate insulating layer 111, there is further provided an STI region 161 for forming a drift region near the drain region 120. The STI region 161 comprises a thin trench preferably formed adjacent to the second doping region 100. The high resistive series path created by the second doping region 100 is formed between the first doping region 121 and the conduction channel 112 across the STI region 161.

Figure 6:
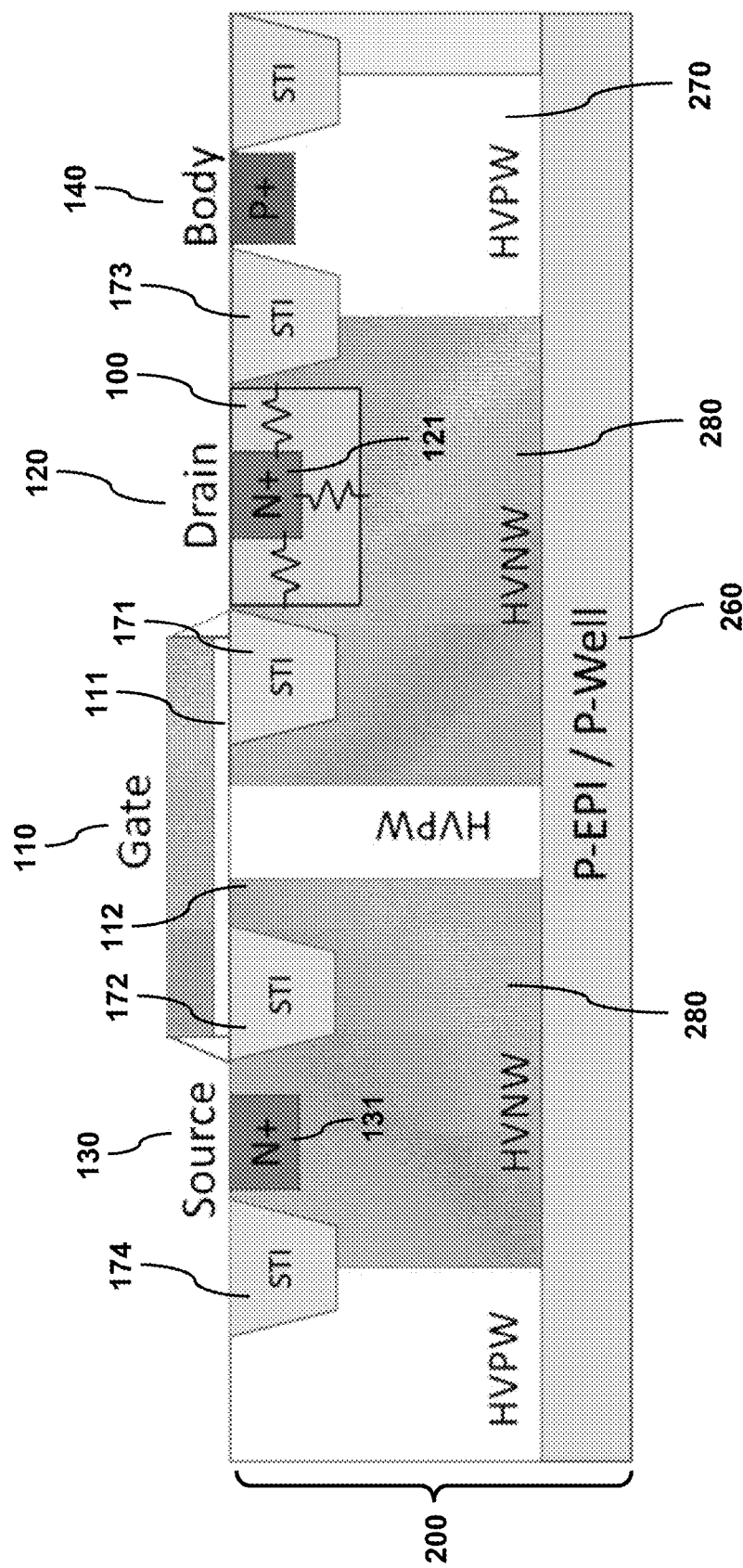
FIG. 6 depicts a cross-sectional view of the layout structure of the NMOS transistor in a symmetric structure for the level shifter of FIG. 3 in accordance with another embodiment of the present disclosure.

In accordance with a second embodiment, the semiconductor device structure for achieving the higher RDSon can also be implemented in a symmetric structure, as illustrated in the cross-sectional view of the layout structure in FIG. 6. For the case of an NMOS transistor, the EPI layer 260 is a P-EPI or P-Well. The body region 140 and the source region 130 are not tied together and separately provided in an HVPW 270 and an HVNW 280 respectively. The drain region 120 is also provided in an HVNW 280. Therefore, the drain region 120 is disposed in a first well region of the first conductive type, and the source region 130 is disposed in a second well region of the first conductive type, wherein the first and second well regions are separated by a well structure of the second conductive type. In certain embodiments, the source region 130 and the body region 140 are separated and isolated by at least an STI region 174 on the upper surface of the substrate 200, while the drain region 120 and the body region 140 are also separated and isolated by at least another STI region 173 on the upper surface of the substrate 200.

With the symmetric structure, the drain region 120 is also formed with a first doping region 121 and a second doping region 100 for increasing the RDSon. The first doping region 121 is doped with a first conductivity impurity. The second doping region 100 disposed around the first doping region 121 is doped with a second conductivity impurity different from the first conductivity impurity. A first STI region 171 is also provided adjacent to the second doping region 100 for forming a drift region near the drain region 120. Similarly, on the source region 130 and at least partially under the gate insulating layer 111, there is also provided a second STI region 172 for forming a drift region near the source region 130.

The description above for the semiconductor device structures in a symmetric structure and an asymmetric structure is provided to the reader in gaining a comprehensive understanding of the use of the second doping region 100 for increasing the RDSon, thereby a high resistive series path can be created to mimic an embedded resistor 51 or 53. Various changes, modifications, and equivalent implementations will be apparent to one skilled in the art.

Figure 7:
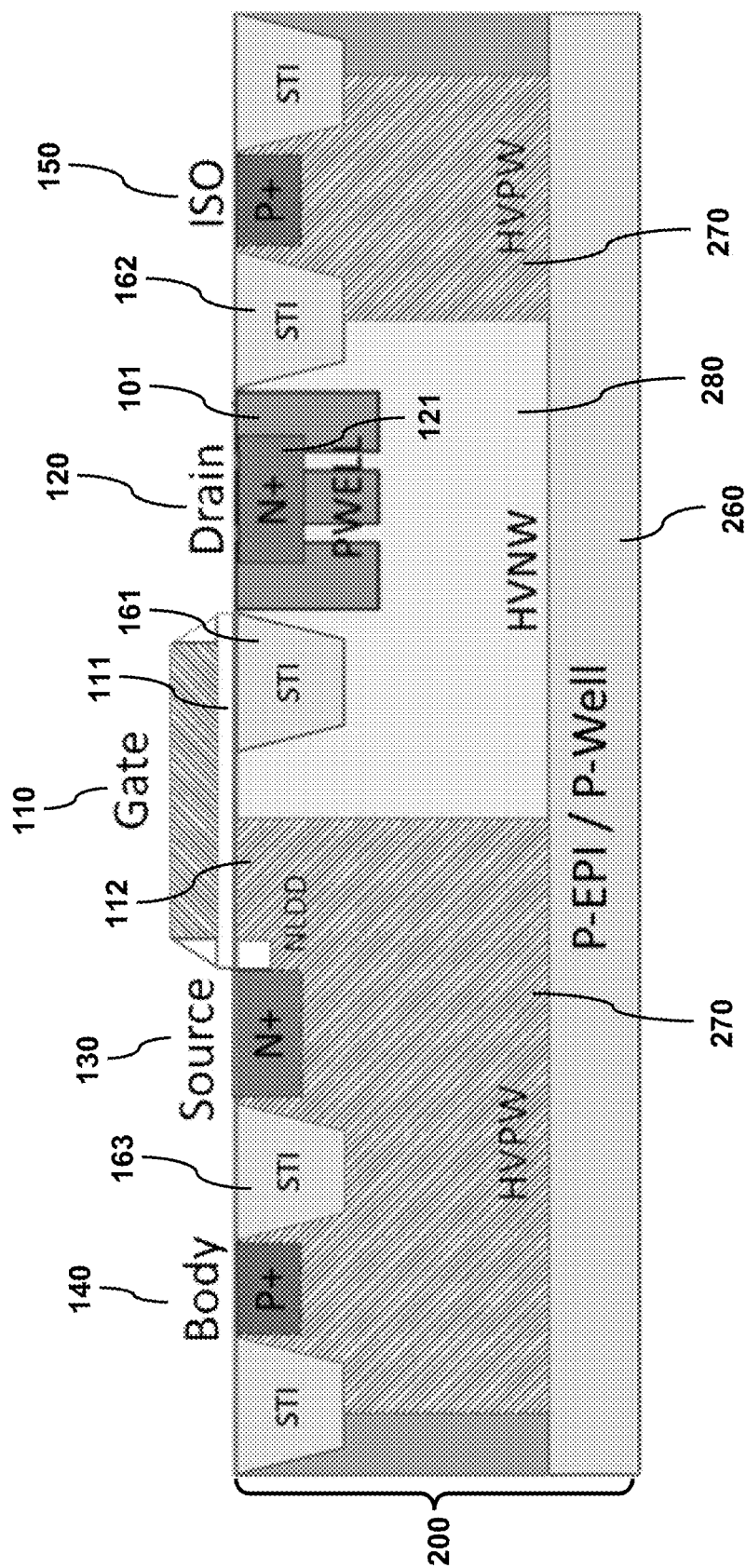
FIG. 7 depicts a cross-sectional view of the layout structure of the NMOS transistor in an asymmetric structure for the level shifter of FIG. 3 in accordance with another embodiment of the present disclosure.
Figure 8:
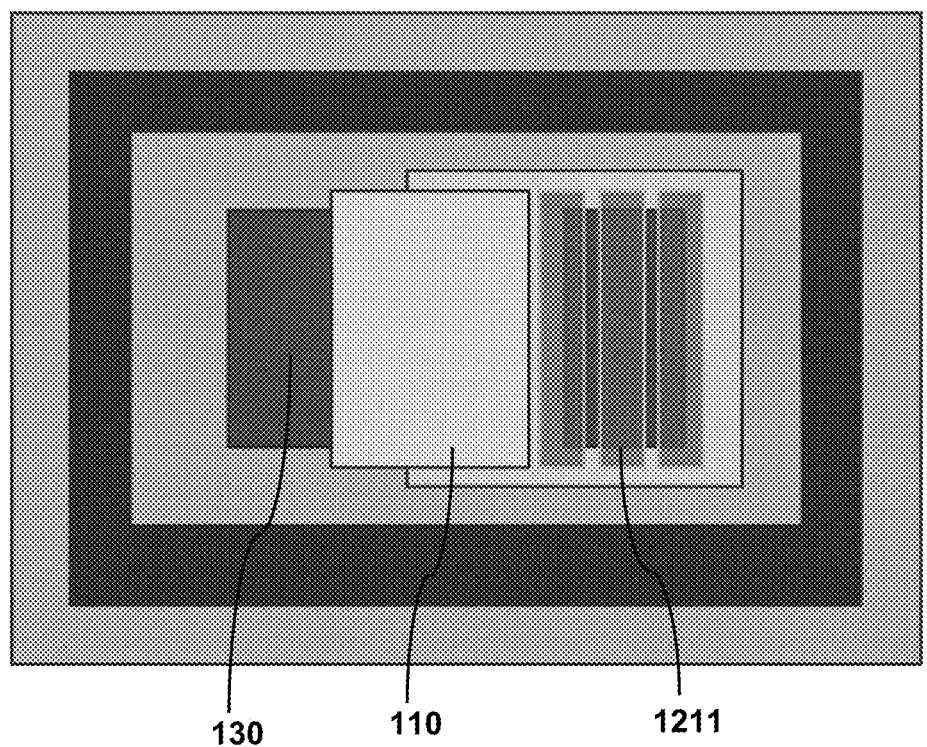
FIG. 8 depicts a top view of the first layout structure with longitudinal strip-shaped implantation for increasing the embedded resistance in accordance with another embodiment of the present disclosure.
Figure 9:
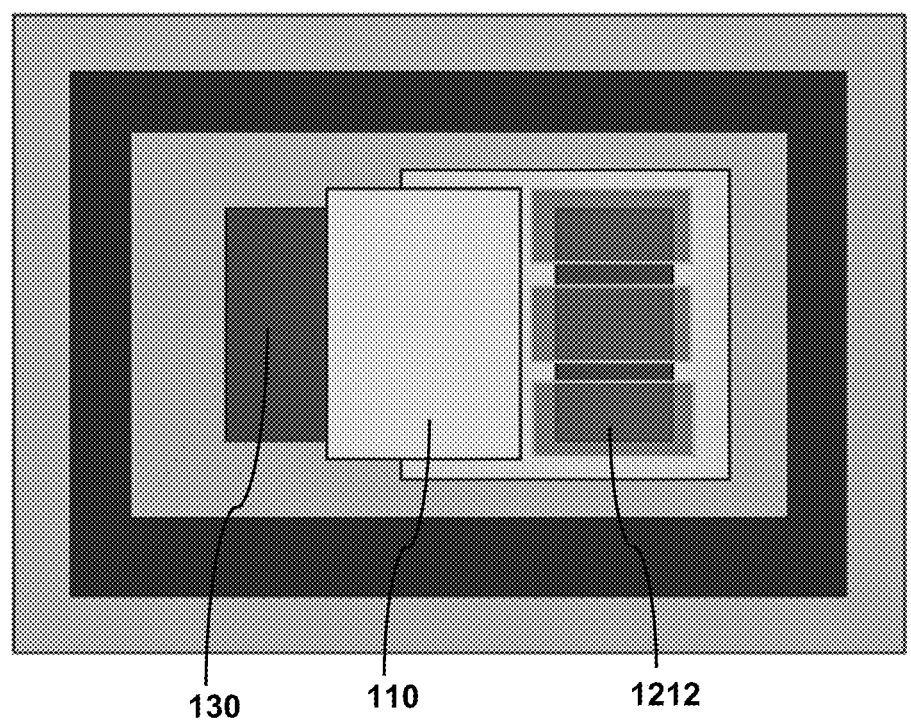
FIG. 9 depicts a top view of the second layout structure with lateral strip-shaped implantation for increasing the embedded resistance in accordance with another embodiment of the present disclosure.
Figure 10:
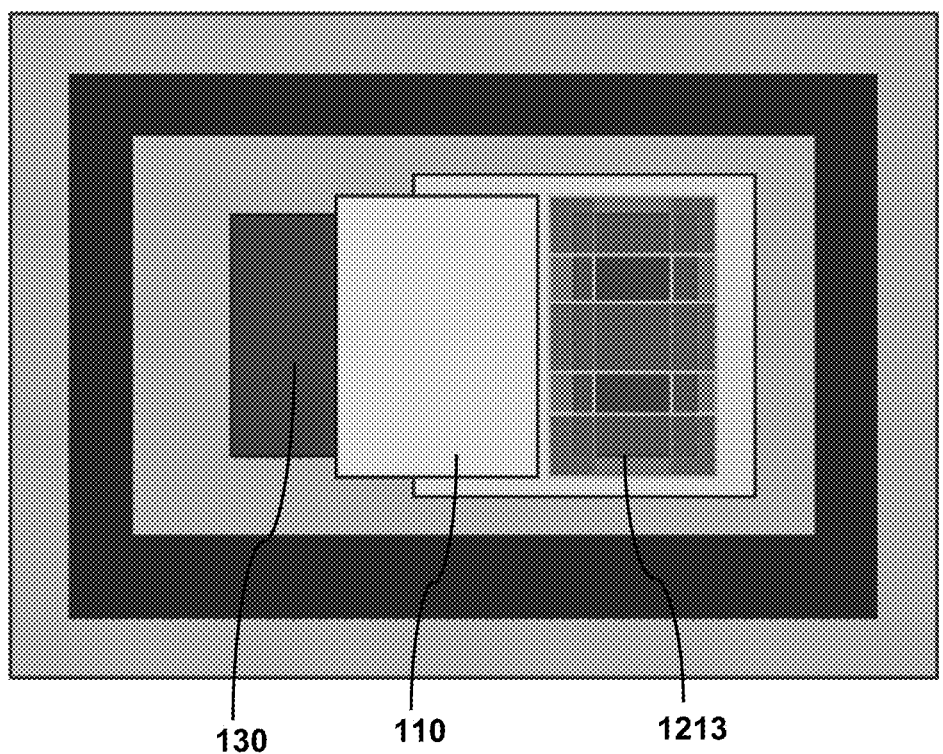
FIG. 10 depicts a top view of the third layout structure with checkerboard implantation for increasing the embedded resistance in accordance with another embodiment of the present disclosure.

Now refer to FIG. 7, an alternative second doping region 101 is illustrated based on an asymmetric structure. The drain region 120 is formed with a first doping region 121 and the alternative second doping region 101 having plural straps doped with a second conductivity impurity for creating a high RDSon than the HVNW 280. There are a number of possible layout structures for realizing strapping. FIGS. 8-10 show three top views of the layout structures.

FIG. 8 conceptually illustrates a layout structure with plural longitudinal strip-shaped implantations 1211 evenly arranged for increasing the embedded resistance in series with the drain terminal of the drain region 120.

FIG. 9 conceptually illustrates a layout structure with plural lateral strip-shaped implantations 1212 evenly arranged for increasing the embedded resistance in series with the drain terminal of the drain region 120.

FIG. 10 conceptually illustrates a layout structure with plural checkerboard implantations 1213 arranged for increasing the embedded resistance in series with the drain terminal of the drain region 120.

Figure 11:
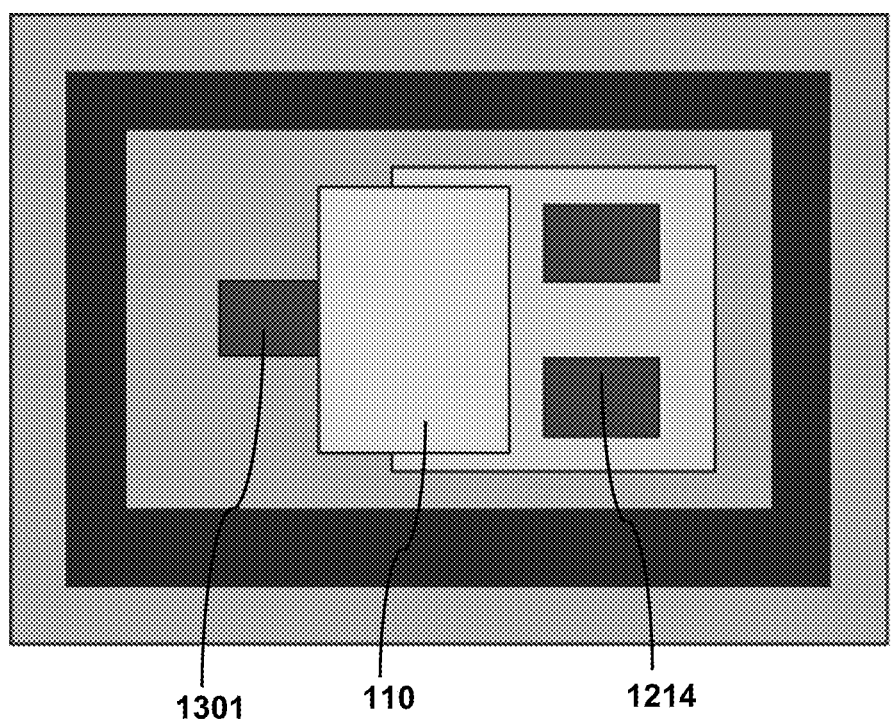
FIG. 11 depicts a top view of the fourth layout structure for reducing the active area in accordance with another embodiment of the present disclosure.

FIG. 11 conceptually illustrates a layout structure with a higher resistance by means of minimizing the active area. In this optional embodiment, the drain terminal 1214, the source terminal 1301, or both the drain and source terminals have reduced active areas for reducing effective channel width, thereby the high resistive series path can be increased and has a higher resistance. The reduction in active area can be ranged from 10% to 90% so that the resistance can be precisely calculated to serve particular applications. This is against the conventional IC design strategy as the conventional approach is focused on minimizing the RDSon as much as possible.

This illustrates the fundamental structure of the semiconductor device for a circuit with a wide supply voltage range in accordance with the present disclosure. It will be apparent that variants of the above-disclosed and other features and functions, or alternatives thereof, may be combined into many other different methods or apparatuses. The present embodiment is, therefore, to be considered in all respects as illustrative and not restrictive. The scope of the disclosure is indicated by the appended claims rather than by the preceding description, and all changes that come within the meaning and range of equivalency of the claims are therefore intended to be embraced therein.

What is claimed is:

1. A level shifter circuit for translating an input signal of a first voltage domain to an output signal of a second voltage domain, the level shifter comprising:
    an input stage for receiving the input signal; and
    a latch stage coupled to the input stage for storing a logic state associated with the input signal and generating the output signal, wherein the latch stage comprises at least a transistor characterized in a substantially matched transconductance with the input stage for preventing a discrete realization of a voltage clamp circuit or a significant increase in transistor area, and wherein the transistor is a semiconductor device comprising:
        a source region having a source doping region formed below a source terminal; and
        a drain region having a first doping region and a second doping region, both formed below a drain terminal, wherein:
the first doping region is doped with a first conductivity impurity;
the second doping region is disposed around the first doping region so as to surround the first doping region, and is doped with a second conductivity impurity; and
the second doping region has a higher on-resistance than the first doping region, thereby a high resistive series path is created by the second doping region to mimic an embedded resistor.

2. The level shifter circuit of claim 1, wherein the drain region is disposed in a first well region of a first conductive type, and the source region is disposed in a second well region of a second conductive type different from the first well region.

3. The level shifter circuit of claim 2, wherein the second doping region has a lower doping concentration of the first conductive type than the first doping region.

4. The level shifter circuit of claim 3, wherein:
the first well region is a high-voltage N-well and the second well region is a high-voltage P-well; and
the first doping region is a heavily doped N+ region, and the second doping region is a lightly doped N+ region.

5. The level shifter circuit of claim 3, wherein:
the first well region is a high-voltage P-well and the second well region is a high-voltage N-well; and
the first doping region is a heavily doped P+ region, and the second doping region is a lightly doped P+ region.

6. The level shifter circuit of claim 2, wherein the first doping region has a doping of the first conductive type; and the second doping region has a doping of the second conductive type.

7. The level shifter circuit of claim 6, wherein:
the first well region is a high-voltage N-well and the second well region is a high-voltage P-well; and
the first doping region is an N+ region, and the second doping region is a P+ region.

8. The level shifter circuit of claim 6, wherein:
the first well region is a high-voltage P-well and the second well region is a high-voltage N-well; and
the first doping region is a P+ region, and the second doping region is an N+ region.

9. The level shifter circuit of claim 2, wherein the second doping region is formed by plural vertical strips, plural horizontal strips, or a checkerboard arrangement of the second conductive type with a higher doping concentration than the first well region.

10. The level shifter circuit of claim 1, wherein the drain region is disposed in a first well region of the first conductive type, and the source region is disposed in a second well region of the first conductive type, thereby the transistor has a symmetrical structure of the source region and the drain region.

11. The level shifter circuit of claim 1, wherein the drain terminal, the source terminal, or both the drain and source terminals have reduced active areas for reducing an effective channel width, thereby the high resistive series path has a higher resistance.

12. The level shifter circuit of claim 1, wherein the semiconductor device further comprises a gate electrode disposed on a gate insulating layer for forming a conduction channel between the source region and the drain region, and wherein the high resistive series path is formed between the first doping region and the conduction channel.

13. The level shifter circuit of claim 12, wherein the semiconductor device further comprises a shallow trench isolation region adjacent to the second doping region and at least partially under the gate insulating layer.

14. The level shifter circuit of claim 1, wherein the latch stage comprises a pair of cross-coupled transistors.

15. A circuit for a multi-voltage system, the circuit comprising:
a first system block operating at a first voltage level;
a second system block operating at a second voltage level; and
a voltage switching module for transmitting a signal from the first system block to the second system block, wherein the voltage switching module comprises a level shifter for translating an input signal of a first voltage domain to an output signal of a second voltage domain, and wherein the level shifter comprising:
an input stage for receiving the input signal; and
a latch stage coupled to the input stage for storing a logic state associated with the input signal and generating the output signal, wherein the latch stage comprises at least a transistor characterized in a substantially matched transconductance with the input stage for preventing a discrete realization of a voltage clamp circuit or a significant increase in transistor area, and wherein the transistor is a semiconductor device comprising:
a source region having a source doping region formed below a source terminal; and
a drain region having a first doping region and a second doping region, both formed below a drain terminal, wherein:
the first doping region is doped with a first conductivity impurity;
the second doping region is disposed around the first doping region so as to surround the first doping region, and is doped with a second conductivity impurity; and
the second doping region has a higher on-resistance than the first doping region, thereby a high resistive series path is created by the second doping region to mimic an embedded resistor.

16. The circuit of claim 15, wherein:
the drain region is disposed in a first well region of a first conductive type, and the source region is disposed in a second well region of a second conductive type different from the first well region;
the second doping region has a lower doping concentration of the first conductive type than the first doping region;
the first well region is a high-voltage N-well and the second well region is a high-voltage P-well; and
the first doping region is a heavily doped N+ region, and the second doping region is a lightly doped N+ region.

17. The circuit of claim 15, wherein:
the drain region is disposed in a first well region of a first conductive type, and the source region is disposed in a second well region of a second conductive type different from the first well region;
the second doping region has a lower doping concentration of the first conductive type than the first doping region;
the first well region is a high-voltage P-well and the second well region is a high-voltage N-well; and
the first doping region is a heavily doped P+ region, and the second doping region is a lightly doped P+ region.

18. The circuit of claim 15, wherein:
the drain region is disposed in a first well region of a first conductive type, and the source region is disposed in a second well region of a second conductive type different from the first well region;
the first doping region has a doping of the first conductive type; and the second doping region has a doping of the second conductive type;
the first well region is a high-voltage N-well and the second well region is a high-voltage P-well; and
the first doping region is an N+ region, and the second doping region is a P+ region.

19. The circuit of claim 15, wherein:
the drain region is disposed in a first well region of a first conductive type, and the source region is disposed in a second well region of a second conductive type different from the first well region;
the first doping region has a doping of the first conductive type; and the second doping region has a doping of the second conductive type;
the first well region is a high-voltage P-well and the second well region is a high-voltage N-well; and
the first doping region is a P+ region, and the second doping region is an N+ region.

20. A discrete electronic component, comprising:
a data input module;
a data output module; and
a voltage switching module for transmitting a signal from the data input module to the data output module, wherein the voltage switching module comprises a level shifter for translating an input signal of a first voltage domain from the data input module to an output signal of a second voltage domain for the data output module, and wherein the level shifter comprising:
an input stage for receiving the input signal; and
a latch stage coupled to the input stage for storing a logic state associated with the input signal and generating the output signal, wherein the latch stage comprises at least a transistor characterized in a substantially matched transconductance with the input stage for preventing a discrete realization of a voltage clamp circuit or a significant increase in transistor area, and wherein the transistor is a semiconductor device comprising:
a source region having a source doping region formed below a source terminal; and
a drain region having a first doping region and a second doping region, both formed below a drain terminal, wherein:
the first doping region is doped with a first conductivity impurity;
the second doping region is disposed around the first doping region so as to surround the first doping region, and is doped with a second conductivity impurity; and
the second doping region has a higher on-resistance than the first doping region, thereby a high resistive series path is created by the second doping region to mimic an embedded resistor.

21. The discrete electronic component of claim 20, wherein:
the drain region is disposed in a first well region of a first conductive type, and the source region is disposed in a second well region of a second conductive type different from the first well region;
the second doping region has a lower doping concentration of the first conductive type than the first doping region;
the first well region is a high-voltage N-well and the second well region is a high-voltage P-well; and
the first doping region is a heavily doped N+ region, and the second doping region is a lightly doped N+ region.

22. The discrete electronic component of claim 20, wherein:
the drain region is disposed in a first well region of a first conductive type, and the source region is disposed in a second well region of a second conductive type different from the first well region;
the second doping region has a lower doping concentration of the first conductive type than the first doping region;
the first well region is a high-voltage P-well and the second well region is a high-voltage N-well; and
the first doping region is a heavily doped P+ region, and the second doping region is a lightly doped P+ region.

23. The discrete electronic component of claim 20, wherein:
the drain region is disposed in a first well region of a first conductive type, and the source region is disposed in a second well region of a second conductive type different from the first well region;
the first doping region has a doping of the first conductive type; and the second doping region has a doping of the second conductive type;
the first well region is a high-voltage N-well and the second well region is a high-voltage P-well; and
the first doping region is an N+ region, and the second doping region is a P+ region.

24. The discrete electronic component of claim 20, wherein:
the drain region is disposed in a first well region of a first conductive type, and the source region is disposed in a second well region of a second conductive type different from the first well region;
the first doping region has a doping of the first conductive type; and the second doping region has a doping of the second conductive type;
the first well region is a high-voltage P-well and the second well region is a high-voltage N-well; and
the first doping region is a P+ region, and the second doping region is an N+ region.

\* \* \* \* \*